(12) United States Patent
Liu et al.

(10) Patent No.: US 11,569,307 B2
(45) Date of Patent: Jan. 31, 2023

(54) ARRAY SUBSTRATE, MANUFACTURING METHOD THEREOF, DISPLAY PANEL AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Jun Liu, Beijing (CN); Liangchen Yan, Beijing (CN); Bin Zhou, Beijing (CN); Wei Li, Beijing (CN); Tongshang Su, Beijing (CN); Yongchao Huang, Beijing (CN); Biao Luo, Beijing (CN); Xuehai Gui, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 304 days.

(21) Appl. No.: 17/043,962

(22) PCT Filed: Apr. 22, 2020

(86) PCT No.: PCT/CN2020/086008
§ 371 (c)(1),
(2) Date: Sep. 30, 2020

(87) PCT Pub. No.: WO2020/216225
PCT Pub. Date: Oct. 29, 2020

(65) Prior Publication Data
US 2021/0159279 A1 May 27, 2021

(30) Foreign Application Priority Data
Apr. 23, 2019 (CN) .......................... 201910330130.4

(51) Int. Cl.
*H01L 27/32* (2006.01)
*H01L 21/77* (2017.01)

(52) U.S. Cl.
CPC ........ *H01L 27/322* (2013.01); *H01L 27/3244* (2013.01); *H01L 2227/323* (2013.01)

(58) Field of Classification Search
CPC . H01L 27/322; H01L 27/323; H01L 27/1288; H01L 27/3244; H01L 27/3262; H01L 27/3279; H01L 51/56
See application file for complete search history.

(56) References Cited

U.S. PATENT DOCUMENTS 7,928,444 B2 * 4/2011 Oh .................... H01L 29/66757
257/59
10,303,021 B2 * 5/2019 Zeng ................. H01L 29/78633
(Continued)

FOREIGN PATENT DOCUMENTS

CN 105700258 A 6/2016
CN 106920891 A 7/2017
(Continued)

OTHER PUBLICATIONS

First office Action dated Oct. 14, 2020 for application No. CN201910330130.4 with English translation attached.

*Primary Examiner* — Mohsen Ahmadi
(74) *Attorney, Agent, or Firm* — Nath, Goldberg & Meyer; Joshua B. Goldberg (57) ABSTRACT

An array substrate is provided, including a base substrate, a semiconductor active layer, a gate electrode, a source electrode, and a drain electrode that are sequentially provided, and further including a first insulating layer, a second insulating layer, a third insulating layer, at least one first via, and at least one second via. Each first via penetrates through the third insulating layer, and in each pixel unit with plural chromatic color resists, each first via is between adjacent (Continued)

two chromatic color resists and filled by one of the adjacent two chromatic color resists. Each second via penetrates through the second insulating layer, the at least one second via is in one-to-one correspondence with the at least one first via, each second via is filled by a chromatic color resist having a same color as that of the chromatic color resist in the corresponding first via.

19 Claims, 4 Drawing Sheets

(56) References Cited

U.S. PATENT DOCUMENTS

| | | | |
|---|---|---|---|
| 2016/0147095 A1* | 5/2016 | Huang | G02F 1/133514 |
| | | | 349/42 |
| 2016/0259191 A1* | 9/2016 | Sun | H01L 27/12 |
| 2017/0012059 A1* | 1/2017 | Zhang | H01L 27/124 |
| 2017/0038653 A1* | 2/2017 | Xu | H01L 29/78675 |
| 2017/0186823 A1* | 6/2017 | Kim | H01L 27/3213 |
| 2021/0215981 A1* | 7/2021 | Wang | G02F 1/13439 |

FOREIGN PATENT DOCUMENTS

| | | |
|---|---|---|
| CN | 108873517 A | 11/2018 |
| CN | 110021653 A | 7/2019 |

\* cited by examiner

ARRAY SUBSTRATE, MANUFACTURING METHOD THEREOF, DISPLAY PANEL AND DISPLAY DEVICE

CROSS REFERENCE TO RELATED APPLICATIONS

This is a National Phase Application filed under 35 U.S.C. 371 as a national stage of PCT/CN2020/086008, filed Apr. 22, 2020, an application claiming the benefit of Chinese Application No. 201910330130.4, filed Apr. 23, 2019, the content of each of which is hereby incorporated by reference in its entirety.

TECHNICAL FIELD

The present disclosure relates to the field of display technologies, in particular to an array substrate, a method for manufacturing an array substrate, a display panel, and a display device.

BACKGROUND

An organic light emitting diode (OLED) display device may include a plurality of OLEDs as light emitting devices and transistors (e.g., thin film transistors) for driving the plurality of OLEDs to display. The transistors may include a top gate type transistor and a bottom gate type transistor, and accordingly, the OLED display device includes a top gate type OLED display device and a bottom gate type OLED display device. In recent years, compared with large-sized bottom gate type OLED display devices, large-sized top gate type OLED display devices have attracted people's attention due to their higher on-state current (Ion), higher aperture ratio, and better stability of an array substrate.

SUMMARY

In a first aspect, embodiments of the present disclosure provide an array substrate, which includes a base substrate, and a semiconductor active layer, a gate electrode, a source electrode, and a drain electrode that are sequentially on the base substrate, wherein the array substrate further includes a first insulating layer, a second insulating layer, a third insulating layer, at least one first via, and at least one second via;

the first insulating layer, the second insulating layer and the third insulating layer are sequentially on the base substrate with the source electrode and the drain electrode;

each first via penetrates through the third insulating layer, and in each pixel unit with a plurality of chromatic color resists, each first via is between adjacent two chromatic color resists and configured to be subsequently filled by one of the adjacent two chromatic color resists; and each second via penetrates through the second insulating layer, a position of the at least one second via is in one-to-one correspondence with that of the at least one first via, a width of each second via is greater than a width of a corresponding first via in a direction parallel to the base substrate, and each second via is configured to be subsequently filled by a chromatic color resist having a same color as that of the chromatic color resist in the first via at a position corresponding to the second via.

In an embodiment, a material of each of the first insulating layer and the third insulating layer includes silicon oxide, and a material of the second insulating layer includes silicon nitride.

In an embodiment, a central axis of each of the at least one first via coincides with a central axis of a corresponding second via in a direction perpendicular to the base substrate.

In an embodiment, each of the at least one first via has a width of 6 microns to 10 microns in the direction parallel to the base substrate.

In an embodiment, on a same side of a central axis of each first via, a distance between a side of the second via corresponding to the first via and a side of the first via in the direction parallel to the base substrate is 8 microns to 12 microns.

In an embodiment, in a direction perpendicular to the base substrate, a cross section of each of the at least one first via is a strip-shape, and a cross section of each of the at least one second via is a strip-shape.

In an embodiment, the array substrate further includes a color filter, wherein
the color filter is on the third insulating layer.

In an embodiment, the color filter includes a red color resist, a green color resist and a blue color resist in each pixel unit;

in the pixel unit, the at least one first via includes two first vias, and the at least one second via includes two second vias; and in the pixel unit, the blue color resist is filled in one of the two first vias and the second via at the position corresponding to the one of the two first vias, and the red color resist is filled in the other of the two first vias and the second via at the position corresponding to the other of the two first vias.

In an embodiment, the array substrate further includes a planarization layer on the color filter.

In an embodiment, in the direction perpendicular to the base substrate, the cross section of each of the at least one first via is a rectangle, and the cross section of each of the at least one second via is a rectangle.

In an embodiment, each of the first insulating layer and the third insulating layer has a thickness of 0.1 microns to 0.2 microns, and the second insulating layer has a thickness of 0.03 microns to 0.05 microns.

In a second aspect, embodiments of the present disclosure provide a display panel, which includes the array substrate according to any one of the foregoing embodiments of the present disclosure.

In a third aspect, embodiments of the present disclosure provide a display device, which includes the display panel according to the foregoing embodiment of the present disclosure.

In a fourth aspect, embodiments of the present disclosure provide a method for manufacturing an array substrate, the method including:

forming a semiconductor active layer, a gate electrode, a source electrode, and a drain electrode sequentially, on a base substrate by a patterning process;

forming a first insulating layer, a second insulating layer, and a third insulating layer sequentially, on the base substrate provided with the source electrode and the drain electrode;

performing a patterning process on the third insulating layer to form at least one first via penetrating through the third insulating layer, wherein in each pixel unit provided with a plurality of chromatic color resists, each first via is provided between adjacent two chromatic color resists and configured to be subsequently filled by one of the adjacent two chromatic color resists; and performing a patterning process on the second insulating layer to form at least one second via penetrating through the second insulating layer, wherein a position of the at least one second via is in one-to-one correspondence with that of the at least one first via, a width of each second via is greater than a width of a corresponding first via in a direction parallel to the base substrate, and each second via is configured to be subsequently filled by a chromatic color resist having a same color as that of the chromatic color resist in the first via at a position corresponding to the second via.

In an embodiment, the performing a patterning process on the third insulating layer to form at least one first via penetrating through the third insulating layer includes:

coating a photoresist on the third insulating layer, and removing at least one portion of the photoresist above the at least one first via to be formed by exposure and development to form at least one preliminary via; and etching the third insulating layer by using carbon tetrafluoride and oxygen to form the at least one first via penetrating through the third insulating layer.

In an embodiment, an angle between a sidewall of each of the at least one preliminary via and the direction parallel to the base substrate is greater than 70°, and a thickness of the photoresist is greater than 1.8 microns.

In an embodiment, the performing a patterning process on the second insulating layer to form at least one second via penetrating through the second insulating layer includes:

etching the second insulating layer by using sulfur hexafluoride and oxygen to form the at least one second via penetrating through the second insulating layer; and removing the photoresist through a stripping process.

In an embodiment, each of the first insulating layer and the third insulating layer is made of silicon oxide, and the second insulating layer is made of silicon nitride.

In an embodiment, each of the first insulating layer and the third insulating layer is formed to have a thickness of 0.1 microns to 0.2 microns, and the second insulating layer is formed to have a thickness of 0.03 microns to 0.05 microns.

In an embodiment, in a direction perpendicular to the base substrate, each of the at least one first via is formed to have a cross section of a rectangle, and each of the at least one second via is formed to have a cross section of a rectangle.

BRIEF DESCRIPTION OF THE DRAWINGS

Various other advantages and benefits will become apparent to one of ordinary skill in the art upon reading the following detailed description of exemplary embodiments. The drawings are only for purposes of illustrating the exemplary embodiments and are not intended to limit the embodiments of the present disclosure. Further, like reference signs refer to like elements throughout the drawings, in which.

DETAILED DESCRIPTION

Exemplary embodiments of the present disclosure will be described in more detail below with reference to the accompanying drawings. Although exemplary embodiments of the present disclosure are shown in the drawings, it should be understood that the present disclosure may be embodied in various forms and should not be limited by the embodiments described herein. Rather, these embodiments are provided such that the present disclosure will be thorough and complete, and will fully convey the scope of the present disclosure to one of ordinary skill in the art.

It should be understood by one of ordinary skill in the art that as used herein, the singular forms "a", "an", "the" and "this" may further include plural referents unless the context clearly indicates otherwise. It will be further understood that the term "include", when used in this specification, specifies the presence of stated features, values, steps, operations, elements, and/or components, but does not exclude the presence or addition of one or more other features, values, steps, operations, elements, components, and/or groups thereof. It will be understood that when an element is referred to as being "connected" to another element, the element may be directly connected to the other element, or intervening elements may be present. Further, "connected" as used herein may include wirelessly connected. As used herein, the term "and/or" includes all or any element and all combinations of one or more of the associated listed items.

It will be understood by one of ordinary skill in the art that, unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Technical solutions of embodiments of the present disclosure will be described below with reference to the drawings.

Figure 1:
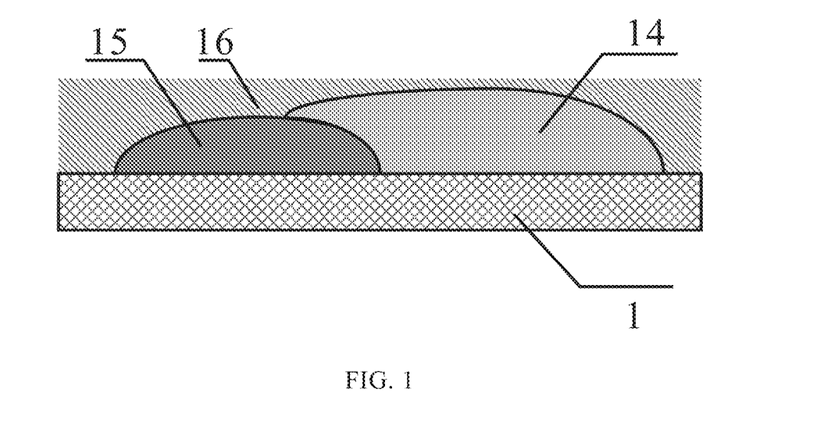
FIG. 1 is a schematic diagram showing that after chromatic color resists are disposed on an array substrate in the related art, a planarization layer disposed on the chromatic color resists is easily separated from the chromatic color resists due to overlapping of adjacent chromatic color resists.

The inventors of the present inventive concept have found that a large-sized organic light emitting diode (OLED) display device currently employs a COA (color filter on array) technology, in which a color filter (which may also be referred to as a color filter layer) is disposed on an inorganic film included in an array substrate, and then a planarization layer is formed on the color filter. Since the color filter is formed on the inorganic film and has a relatively large thickness, the color filter protrudes from the inorganic film. To ensure a planarization effect, an organic film planarization layer formed subsequently needs to have a large thickness, which reduces a light transmittance in an opening region. Moreover, in order to prevent light leakage, edges between adjacent two color resists of different colors of the color filter are disposed to overlap each other, as shown in FIG. 1. FIG. 1 shows a case where a blue color resist 15 and a green color resist 14 on a base substrate 1 overlap each other. Under the condition of ensuring that the requirements of chrominance and color specification of the color filter are met, after the blue color resist 15 overlap the green color resist 14, since a thickness of the color filter at an overlapping position of the color resists 14 and 15 is thicker, a thickness of the planarization layer at the overlapping position is thinner when the planarization layer 16 is formed. Thus, the planarization layer 16 is thinner at the overlapping position and is easy to break, and the problem that the planarization layer 16 is separated from the color filter is easy to occur. As a result, the reliability of the array substrate is reduced.

Figure 2:
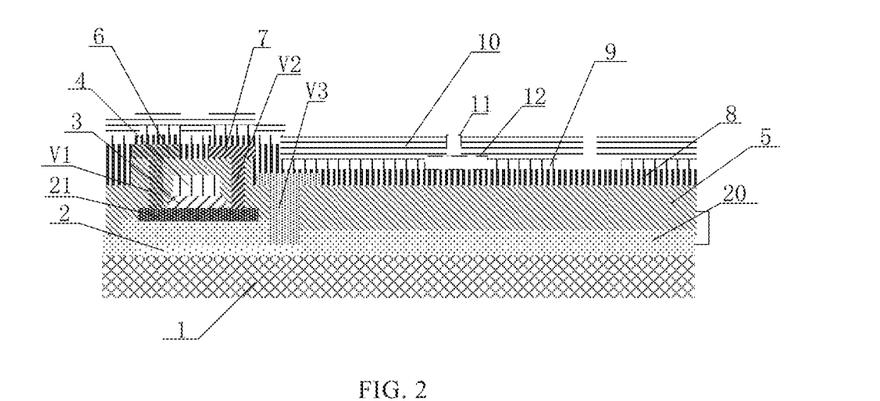
FIG. 2 is a schematic diagram showing a structure of an array substrate according to an embodiment of the present disclosure.

In a first aspect, an embodiment of the present disclosure provides an array substrate, as shown in FIG. 2. The array substrate includes: a base substrate 1, and a semiconductor active layer 21, a gate insulating layer 3, a gate electrode 4, an interlayer insulating layer 5, a source electrode 6, and a drain electrode 7 that are sequentially positioned on the base substrate 1. In addition, the array substrate may further include: a first insulating layer 8, a second insulating layer 9, a third insulating layer 10, at least one first via 11, and at least one second via 12. The first insulating layer 8, the second insulating layer 9, and the third insulating layer 10 are sequentially disposed on the base substrate 1 provided with the source electrode 6 and the drain electrode 7. The at least one first via 11 may be in one-to-one correspondence with the at least one second via 12, and each of the at least one first via 11 and its corresponding second via 12 may overlap each other in a direction perpendicular to the base substrate 1 (e.g., the vertical direction in FIG. 2). Further, each of the at least one first via 11 and the corresponding second via 12 communicate with each other such that they are filled with a color resist of a same color.

Figure 3:
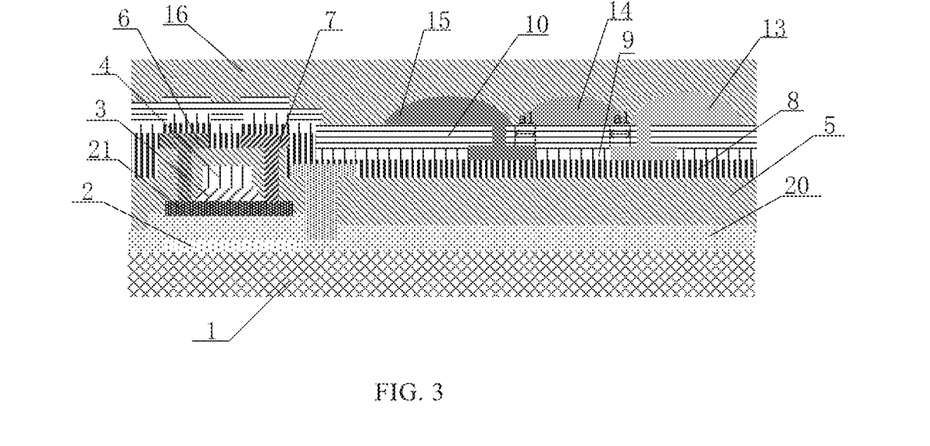
FIG. 3 is a schematic diagram showing a structure of another array substrate according to an embodiment of the present disclosure.

As shown in FIG. 2, each first via 11 penetrates through the third insulating layer 10, and in each pixel unit provided with a plurality of chromatic color resists 13, 14 and 15 (see FIG. 3), each first via 11 is located between a pair of adjacent two chromatic color resists (e.g., located between the adjacent two chromatic color resists 13 and 14 or between the adjacent two chromatic color resists 14 and 15, as shown in FIG. 3), for being filled by one of the pair of adjacent two chromatic color resists subsequently. Each second via 12 penetrates through the second insulating layer 9, a position of each second via 12 corresponds to a position of one first via 11 (e.g., each second via 12 overlaps one first via 11 in a direction perpendicular to the base substrate 1 (e.g., the vertical direction in FIGS. 2 and 3)), and a width of each second via 12 is greater than a width of the corresponding first via 11 in a direction parallel to the base substrate 1 (e.g., the horizontal direction in FIGS. 2 and 3), and each second via 12 is subsequently filled by a chromatic color resist having the same color as a color of the chromatic color resist within the first via 11 corresponding to the second via 12.

In the array substrate according to the embodiment of the present disclosure, the first insulating layer 8, the second insulating layer 9, and the third insulating layer 10 are sequentially provided on the base substrate 1 provided with the source electrode 6 and the drain electrode 7, the at least one first via 11 is provided to penetrate through the third insulating layer 10, and the at least one second via 12 is provided to penetrate through the second insulating layer 9. Since in each pixel unit in which the plurality of chromatic color resists are disposed, each first via 11 is located between a pair of adjacent two chromatic color resists (in other words, each first via 11 is located between adjacent two sub-pixels), each second via 12 is located corresponding to the position of one first via 11, and the width of each second via 12 is greater than the width of the corresponding first via 11 in the direction parallel to the base substrate 1. As such, when the plurality of chromatic color resists are subsequently disposed, one of the pair of adjacent two chromatic color resists may fill one first via 11 and the second via 12 corresponding to the one first via 11, such that an overlapping region a1 (see FIG. 3) may be formed between the one and the other chromatic color resists of the pair of adjacent two chromatic color resists. Compared with the related art, the array substrate according to the embodiment does not necessarily include a color resist overlapping region in the color filter (as shown in FIG. 1) for preventing light leakage at the juncture (or overlapping) position of adjacent two chromatic color resists. Thus, after a planarization layer is arranged on the array substrate according to the present embodiment, the planarization layer has a relatively uniform thickness and is not easy to be separated from the color filter.

Further, as shown in FIG. 2, the array substrate may further include a light-shielding layer 2 on the base substrate 1, and a buffer layer 20 on the light-shielding layer 2. The light-shielding layer 2 may be positioned between the base substrate 1 and the semiconductor active layer 21 for shielding light irradiated to the semiconductor active layer 21 to prevent a performance of the semiconductor active layer 21 from degrading. For example, an orthographic projection of the light-shielding layer 2 on the base substrate 1 may at least completely cover an orthographic projection of the semiconductor active layer 21 on the base substrate 1, such that the light-shielding layer 2 may effectively shield light irradiated to the semiconductor active layer 21. The buffer layer 20 may be positioned between the light-shielding layer 2 and the semiconductor active layer 21.

In an embodiment, the second insulating layer 9 and the third insulating layer 10 need to be subjected to an etching process during a manufacturing process, and the third insulating layer 10 should not be affected when the second insulating layer 9 is subjected to the etching process. Similarly, when the third insulating layer 10 is etched, the second insulating layer 9 should not be affected. For this purpose, in the present embodiment, a material of each of the first insulating layer 8 and the third insulating layer 10 is silicon oxide, and a material of the second insulating layer 9 is silicon nitride.

Figure 7:
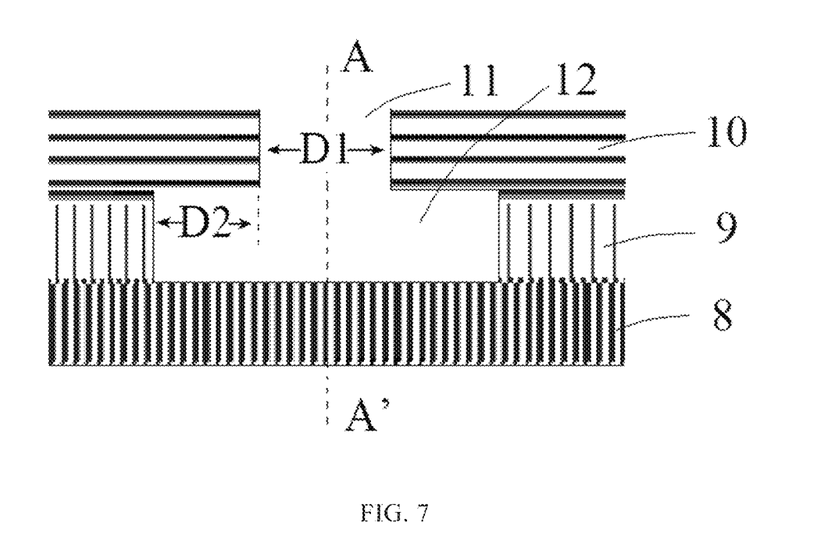
FIG. 7 is a schematic diagram showing a positional relationship and a size relationship of a first via and a second via of an array substrate according to an embodiment of the present disclosure.

In an embodiment, in order to enable a chromatic color resist to better flow into each first via 11 and the corresponding second via 12 during the plurality of chromatic color resists (which are in a liquid state before being cured) are subsequently disposed, in the present embodiment, a central axis AA' of each first via 11 coincides with a central axis AA' of the corresponding second via 12 in the direction perpendicular to the base substrate 1, as shown in FIG. 7.

In an embodiment, as shown in FIGS. 2 and 7, a width D1 of each first via 11 is 6 microns to 10 microns in the direction parallel to the base substrate 1 (i.e., the horizontal direction in the figures).

In an embodiment, as shown in FIGS. 2 and 7, in the direction parallel to the base substrate 1 (i.e., the horizontal direction in the figures), and on the same side of the central axis AA' of each first via 11 (e.g., on the left side of the central axis of the first via 11), a distance D2 between a side of the corresponding second via 12 and a side of the first via 11 is 8 microns to 12 microns. As such, a color resist material filled in each first via 11 and the corresponding second via 12 may effectively prevent light leakage between the adjacent two chromatic color resists corresponding to the first via 11. However, it is also possible for one of ordinary skill in the art to adjust the sizes of each first via 11 and the corresponding second via 12 according to different design requirements based on the present disclosure.

In an embodiment, in the direction perpendicular to the base substrate 1, a cross section of each first via 11 has a strip-shape, and a cross section of the corresponding second via 12 is a strip-shape. Sidewalls of each first via 11 and the corresponding second via 12 may be perpendicular to the base substrate 1, respectively, in consideration of the fluidity of a chromatic color resist and the ease with which the chromatic color resist fill each first via 11 and the corresponding second via 12. In other words, in the direction perpendicular to the base substrate 1, the cross section of each first via 11 may be a rectangle, and the cross section of the corresponding second via 12 may be a rectangle.

In an embodiment, as shown in FIG. 3, the array substrate may further include the color filter positioned on the third insulating layer 10. For example, a portion of the color filter in each pixel unit may include: a red color resist 13, a green color resist 14, and a blue color resist 15. In this case, in the pixel unit, the at least one first via 11 includes two first vias 11, and the at least one second via 12 includes two second vias 12. In addition, in the pixel unit, the blue color resist 15 is filled in one first via 11 and the second via 12 at a position corresponding to the one first via 11, and the red color resist 13 is filled in the other first via 11 and the second via 12 at a position corresponding to the other first via 11. It should be understood that the present embodiment is exemplified by an example in which the color filter includes three chromatic color resists of red color resist 13, green color resist 14 and blue color resist 15 in each pixel unit, but the present disclosure is not limited thereto. For example, the number of the chromatic color resists included in the color filter in each pixel unit may be less than 3 or greater than 3, as long as one first via 11 and one corresponding second via 12 are formed between adjacent two chromatic color resists.

In an embodiment, as shown in FIG. 3, the array substrate may further include a planarization layer 16 disposed on the color filter. Since the edge positions of the red color resist 13, the green color resist 14 and the blue color resist 15 according to the embodiment of the present disclosure do not overlap each other in the color filter, the planarization layer 16 only needs to planarize the red color resist 13, the green color resist 14 and the blue color resist 15 when the planarization layer 16 is formed. Therefore, the planarization layer 16 has better flatness, and is not easy to be separated from the color filter, thereby improving the reliability of the array substrate.

In addition, as shown in FIG. 2, the array substrate may further include a first contact hole V1, a second contact hole V2, and a third contact hole V3. The first contact hole V1 penetrates through the interlayer insulating layer 5 for connecting the source electrode 6 to the semiconductor active layer 21. The second contact hole V2 penetrates through the interlayer insulating layer 5 for connecting the drain electrode 7 to the semiconductor active layer 21. The third contact hole V3 penetrates through the interlayer insulating layer 5 and the buffer layer 20, for further connecting the source electrode 6 to the light-shielding layer 2 to prevent accumulation of charges on the light-shielding layer 2 and thus prevent the light-shielding layer 2 from becoming an additional gate electrode.

With further reference to FIG. 3, in each pixel unit, since one first via 11 and one corresponding second via 12 according to the embodiments of the present disclosure are disposed between the red color resist 13 and the green color resist 14, and one first via 11 and one corresponding second via 12 according to the embodiments of the present disclosure are disposed between the green color resist 14 and the blue color resist 15, when the red color resist 13 and the blue color resist 15 are disposed, each of the red color resist 13 and the blue color resist 15 will flow into the corresponding first via 11 and the corresponding second via 12, and thus color resist overlapping regions a1 are formed under the green color resist 14. That is, among the red color resist 13, the green color resist 14 and the blue color resist 15, the chromatic color resists on both sides (e.g., the red color resist 13 and the blue color resist 15) are indented so as not to overlap with the green color resist 14 positioned in the middle, respectively, and in turn fill the corresponding first vias 11 and the corresponding second vias 12, respectively. The middle color resist (e.g., the green color resist 14) do not need to be indented. In this way, two color resist overlapping regions a1 are formed. Since the two color resist overlapping regions a1 are formed, light leakage may be prevented. Meanwhile, overlapping between the chromatic color resists in the related art as shown in FIG. 1 is not formed between any two of the red color resist 13, the green color resist 14 and the blue color resist 15, such that the planarization layer 16 has a relatively uniform thickness, thereby avoiding the problem that the planarization layer 16 is separated from the color filter, and improving the reliability of the array substrate.

In a second aspect, embodiments of the present disclosure provide a display panel including the array substrate according to any one embodiment of the first aspect. Since the display panel according to the second aspect includes the array substrate according to the first aspect, the display panel has the same advantages as those of the array substrate. Therefore, the advantageous effects of the display panel according to the second aspect are not repeated herein. In addition, the display panel may further include a pixel driving circuit to drive pixel units of the array substrate to display information, and the pixel driving circuit may be a conventional pixel driving circuit.

In a third aspect, embodiments of the present disclosure provide a display device including the display panel according to the second aspect. Since the display device according to the third aspect includes the display panel according to the second aspect, the display device has the same advantageous effects as those of the display panel. Therefore, the advantageous effects of the display device according to the third aspect will not be repeated herein. In addition, the display device may further include a touch panel disposed on a light emitting side of the display panel, and may further include other known components.

Figure 4:
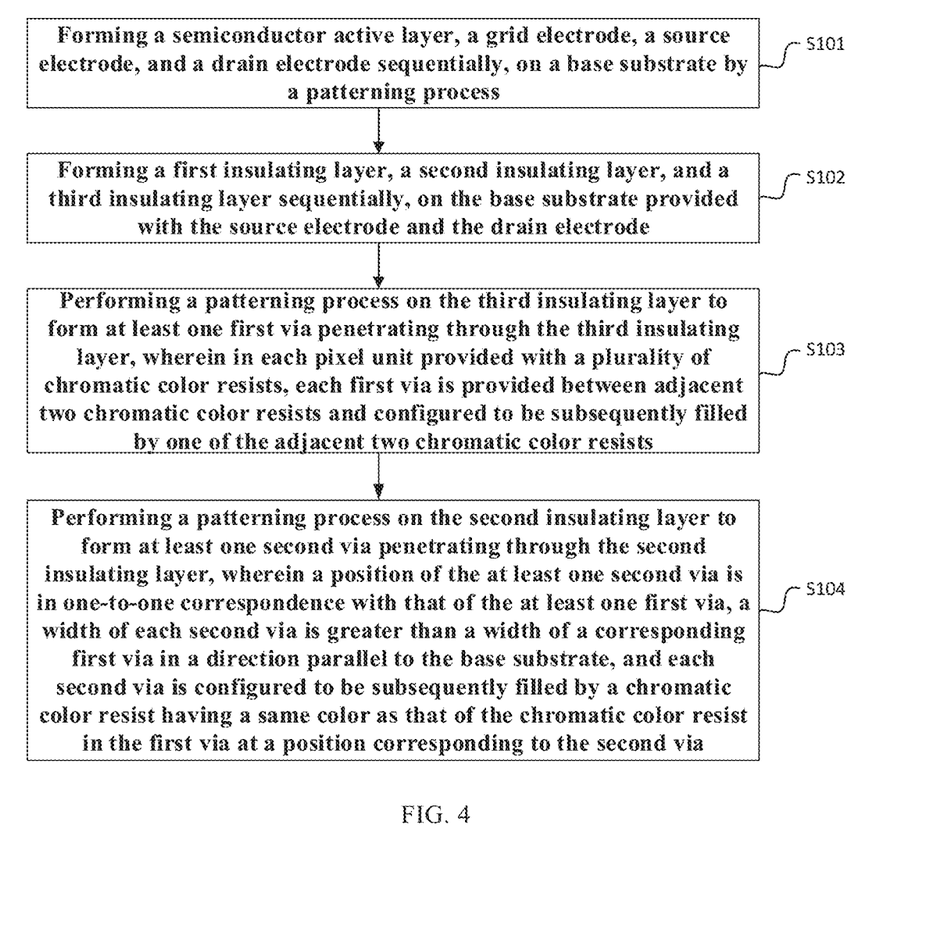
FIG. 4 is a schematic flowchart of a method for manufacturing an array substrate according to an embodiment of the present disclosure.

In a fourth aspect, FIG. 4 shows a flowchart of a method for manufacturing an array substrate according to an embodiment of the present disclosure. As shown in FIG. 4, the method for manufacturing an array substrate may include the following steps S101 to S104.

In step S101: a semiconductor active layer 21, a gate insulating layer 3, a gate electrode 4, an interlayer insulating layer 5, a source electrode 6, and a drain electrode 7 are sequentially formed on a base substrate 1, by a patterning process.

In step S102: a first insulating layer 8, a second insulating layer 9, and a third insulating layer 10 are sequentially formed on the base substrate 1 on which the source electrode 6 and the drain electrode 7 are formed.

In step S103: a patterning process is performed on the third insulating layer 10 to form at least one first via 11 penetrating through the third insulating layer 10, wherein in each pixel unit provided with the chromatic color resists 13, 14 and 15 (see FIG. 3), each of the at least one first via is located between a pair of adjacent two chromatic color resists 13 and 14 or between a pair of adjacent two chromatic color resists 14 and 15, and may be filled by one of the pair of adjacent two chromatic color resists subsequently.

In step S104: a patterning process is performed on the second insulating layer 9 to form at least one second via 12 penetrating through the second insulating layer 9, wherein the position(s) of the at least one second via 12 is in one-to-one correspondence with the position(s) of the at least one first via 11, a width of each second via 12 in the direction parallel to the base substrate 1 is greater than a width of the corresponding first via 11, and each second via 12 may be subsequently filled by a chromatic color resist having the same color as that of the chromatic color resist in the first via 11 at the position corresponding to the second via 12.

In an embodiment, performing a patterning process on the third insulating layer 10 to form at least one first via 11 penetrating through the third insulating layer 10 in step S103 may include the following steps S103a and S103b.

Figure 6:
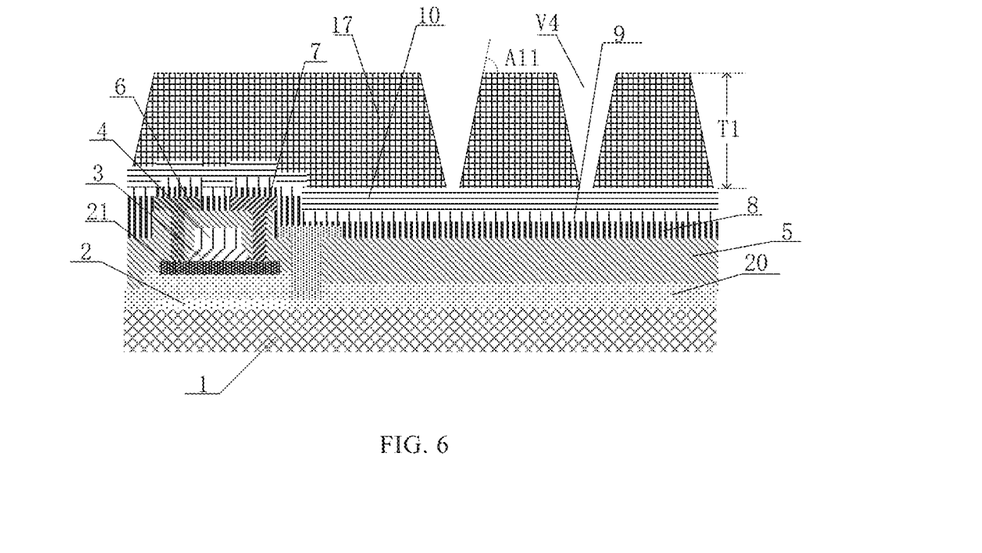
FIG. 6 is a schematic diagram showing a structure of an array substrate when a first via and a second via are formed therein according to an embodiment of the present disclosure.

In step S103a, a photoresist 17 is coated on the third insulating layer 10, and portion(s) of the photoresist above the at least one first via 11 to be formed is/are removed by exposure and development to form at least one preliminary via V4, as shown in FIG. 6.

In step S103b, the third insulating layer 10 is etched by using carbon tetrafluoride and oxygen to form the at least one first via 11 penetrating through the third insulating layer 10.

As described above, in the present embodiment, since the cross sections of each first via 11 and the corresponding second via 12 may be formed as strip-shapes (e.g., rectangles), an angle A11 between a sidewall of the preliminary via V4 in the photoresist 17 and the third insulating layer (e.g., the horizontal direction in the figure) at the position corresponding to each first via 11 is larger than 70° (further alternatively larger than 80°), and a thickness of the photoresist is larger than 1.8 microns (further alternatively larger than 2.0 microns). However, other angles and thicknesses may be set by one of ordinary skill in the art according to design requirements based on the present disclosure.

In an embodiment, performing a patterning process on the second insulating layer 9 to form at least one second via 12 penetrating through the second insulating layer 9 in step S104 may include the following steps S104a and S104b.

In step S104a, the second insulating layer 9 is etched by using sulfur hexafluoride and oxygen to form the at least one second via 12 penetrating through the second insulating layer 9.

In step S104b, the remaining photoresist is remove a stripping process.

The manufacturing process of the array substrate according to an embodiment of the present disclosure is further described below with reference to FIGS. 5 and 6.

Figure 5:
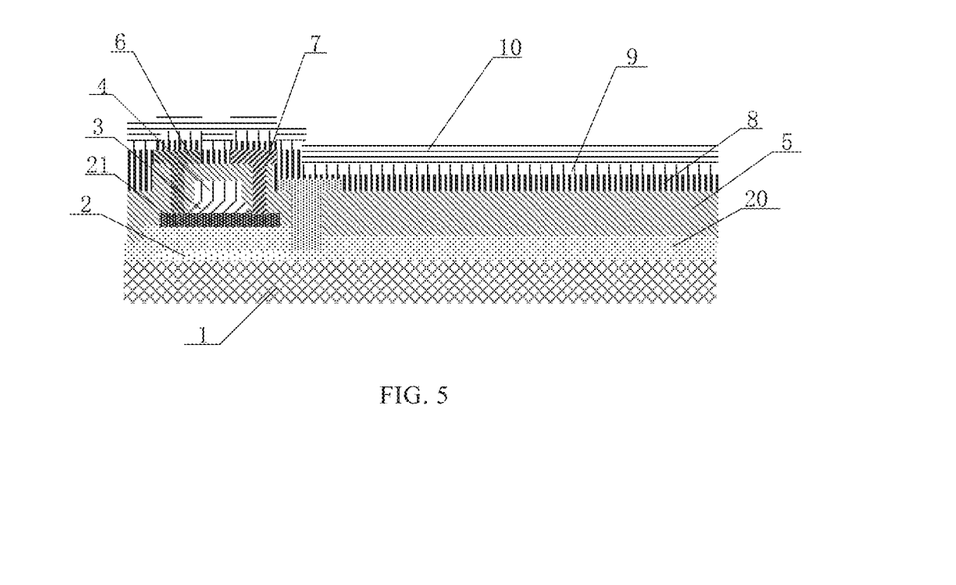
FIG. 5 is a schematic diagram showing a structure of an array substrate without a first via and a second via formed therein according to an embodiment of the present disclosure.

As shown in FIG. 5, in an embodiment, a metal layer is deposited on a base substrate 1 (e.g., a glass substrate), wherein a material of the metal layer may be a metal such as molybdenum or a molybdenum-niobium alloy, and a thickness of the metal layer is 0.10 microns to 0.15 microns. Next, the light-shielding layer 2 is formed in a region of a thin film transistor (TFT) of the array substrate (e.g., a region of the array substrate shown in FIG. 2 including the semiconductor active layer 21, the gate electrode 4, the source electrode 6, and the drain electrode 7) by a photolithography process and/or a wet etching process. The wet etching process may be performed with a mixed acid (e.g., a mixed acid of nitric acid and hydrochloric acid mixed in a certain ratio). Then, a buffer layer 20 is deposited. The buffer layer 20 may be made of silicon oxide, and have a thickness of 0.3 microns to 0.5 microns.

Then, an indium-gallium-zinc oxide (IGZO) thin film is deposited and subjected to a photolithography process and a wet etching process, to form the semiconductor active layer 21, wherein a thickness of the semiconductor active layer 21 is 0.05 microns to 0.1 microns. Next, an insulating layer is deposited, and may be made of silicon oxide and has a thickness of 0.1 microns to 0.2 microns. Then, a layer of metal is deposited, the metal may be copper and the like, have a thickness of 0.4 microns to 0.5 microns, and then the gate electrode 4 and a pattern of a gate line are formed by a patterning process. After the gate electrode 4 is wet etched, a mask for etching the gate electrode is left for dry etching the insulating layer, to form the gate insulating layer 3. In an embodiment, the etching may be performed by using a mixture of carbon tetrafluoride and oxygen for dry etching, wherein a flow rate of the carbon tetrafluoride may be 2000 ml/min (i.e., standard milliliters per minute) to 2500 ml/min, and a flow rate of the oxygen may be 1000 ml/min to 1500 ml/min.

After the gate insulating layer 3 is formed, a conductorization process is performed on the IGZO thin film of the semiconductor active layer 21 at the positions in contact with the source electrode 6 and the drain electrode 7 and at a capacitance region (e.g., a region of the semiconductor active layer 21 between its left end and its position in contact with the source electrode 6 and/or a region of the semiconductor active layer 21 between its right end and its position in contact with the drain electrode 7) to reduce a resistance of the IGZO thin film. Here, the IGZO thin film may be plasma implanted with ammonia gas or helium gas in the conductorization process, and the mask for etching the gate electrode may be stripped off after the conductorization process is completed. Then, the interlayer insulating layer 5 is deposited. The interlayer insulating layer 5 may be made of silicon oxide, and have a thickness of 0.45 microns to 0.6 microns. Next, a dry etching process for forming contact holes (i.e., a contact-hole dry etching process) is performed on the interlayer insulating layer 5 (and the buffer layer 20) by using a mask to form the first to third contact holes V1, V2, and V3, such that the source electrode 6 formed later is connected to the semiconductor active layer 21 through the first contact hole V1, the drain electrode 7 formed later is connected to the semiconductor active layer 21 through the second contact hole V2, and the source electrode 6 is connected to the light-shielding layer 2 through the third contact hole V3. And then a layer of metal is deposited, wherein the metal may be copper, aluminum, or the like, and have a thickness of 0.5 microns to 0.7 microns. Then, the source electrode 6 and the drain electrode 7 are formed by a patterning process.

Next, the first insulating layer 8, the second insulating layer 9, and the third insulating layer 10 are sequentially deposited. Each of the first insulating layer 8 and the third insulating layer 10 may include silicon oxide, and the second insulating layer 9 may include silicon nitride. A thickness of each of the first insulating layer 8 and the third insulating layer 10 is 0.1 microns to 0.2 microns, and a thickness of the second insulating layer 9 is 0.03 microns to 0.05 microns. In this way, the formation of the at least one first via 11 and the at least one second via 12 as described above is facilitated. So far, the structure formed by the method is as shown in FIG. 5.

As shown in FIG. 6, a layer of photoresist 17 is then coated on the third insulating layer 10, and at least one portion of the photoresist above the at least one first via 11 to be formed is removed by exposure and development to form at least one preliminary via V4. In the present embodiment, since adjacent two chromatic color resists need overlap each other to prevent light leakage between the adjacent two chromatic color resists, and example in which each pixel unit includes a red color resist 13, a green color resist 14 and a blue color resist 15 is taken in the present embodiment, each pixel unit may include two overlapping strips a1. In consideration of the fluidity of a chromatic color resist, sidewalls of each first via 11 and the corresponding second via 12 may be formed to be perpendicular to the base substrate 1 (e.g., cross sections of each first via 11 and the corresponding second via 12 in the direction perpendicular to the base substrate 1 may be rectangles). For this purpose, an angle A11 between a sidewall of the preliminary via V4 in the photoresist 17 above a position corresponding to each first via 11 and the third insulating layer 10 (e.g., the horizontal direction in FIG. 6) is 70° or more (further alternatively 80° or more), and a thickness T1 of the photoresist 17 is greater than 1.8 microns (further alternatively greater than 2.0 microns).

Next, dry etching is performed, in which the third insulating layer 10 is etched firstly by using carbon tetrafluoride and oxygen, and by using a high source power and a high bias power. Since the angle between the sidewall of the preliminary via V4 in the photoresist 17 and the third insulating layer 10 is large, and the thickness of the photoresist 17 is relatively great, the third insulating layer 10 may be dry etched only in the vertical direction to form the at least one first via 11. Next, the second insulating layer 9 is etched, by using sulfur hexafluoride and oxygen, and by using a high source power and low or no bias power. Because the isotropy effect is stronger during the dry etching using the sulfur hexafluoride and because low or no bias power is adopted, the dry etching is similar to wet etching, which has no etching effect on the first insulating layer 8 and the third insulating layer 10 but has a stronger etching effect on the second insulating layer 9. Therefore, the at least one second via 12 each having a strip-shape may be formed in the second insulating layer 9, and a width of each formed second via 12 may be greater than a width of the corresponding first via 11 in the horizontal direction. To ensure that each of the color resist overlapping regions al is formed subsequently, on a same side of the central axis of each first via 11, a distance between a side of the second via 12 corresponding to the first via 11 and a side of the first via 11 may be controlled to be between 8 microns and 12 microns. After two steps of dry etching are completed, the remaining photoresist 17 is removed, and the array substrate as shown in FIG. 2 is formed.

Thereafter, a process for forming the color filter may be performed. For example, the blue color resist 15, the red color resist 13, and the green color resist 14 may be sequentially formed as shown in FIG. 3. Since the first vias 11 and the second vias 12 are formed, after processes for applying the blue color resist 15 and the red color resist 13 are completed, the blue color resist 15 will flow into the corresponding first via 11 and the corresponding second via 12 to form a color resist overlapping region a1, and the red color resist 13 will flow into the corresponding first via 11 and the corresponding second via 12 to form another color resist overlapping region a1. Thus, the green color resist 14 does not need to be formed to overlap with the adjacent blue color resist 15 and the adjacent red color resist 13 in the color filter to prevent light leakage, and corresponding color resist overlapping regions al may be formed on both sides of the green color resist 14 by merely forming the green color resist 14 conventionally. In this way, a flatness of a planarization layer 16 in the overlapping regions is uniform when the planarization layer 16 is formed subsequently, such that the planarization layer 16 will not be separated from the color filter, thereby improving the reliability of the array substrate.

The array substrate, the manufacturing method thereof, the display panel and the display device provided by the foregoing embodiments of the present disclosure may achieve at least the following advantageous technical effects.

In the array substrate provided by the embodiments of the present disclosure, the first insulating layer, the second insulating layer, and the third insulating layer are sequentially provided on the base substrate provided with the source electrode and the drain electrode, the at least one first via is provided to penetrate through the third insulating layer, and the at least one second via is provided to penetrate through the second insulating layer. In each pixel unit in which the plurality of chromatic color resists are disposed, each first via is located between a pair of adjacent two chromatic color resists, each second via is located at a position corresponding to the position of one first via, and the width of each second via is greater than the width of the corresponding first via in the direction parallel to the base substrate. As such, when the plurality of chromatic color resists are subsequently disposed, one of the pair of adjacent two chromatic color resists may fill one first via and the second via corresponding to the one first via, such that an overlapping region a1 may be formed between the one and the other chromatic color resists of the pair of adjacent two chromatic color resists. Compared with the related art, the array substrate according to the embodiments of the present disclosure does not necessarily include a color resist overlapping region in the color filter for preventing light leakage at the juncture position of adjacent two chromatic color resists. Thus, after a planarization layer is arranged on the color filter, the planarization layer has a relatively uniform thickness and is not easy to be separated from the color filter.

The foregoing is only some embodiments of the present disclosure. It should be noted that modifications and variations may be made therein by one of ordinary skill in the art without departing from the principles of the present disclosure, and such modifications and variations shall fall within the scope of the present disclosure as defined by the appended claims.

What is claimed is:

1. An array substrate, comprising a base substrate, and a semiconductor active layer, a gate electrode, a source electrode, and a drain electrode that are sequentially on the base substrate, wherein the array substrate further comprises a first insulating layer, a second insulating layer, a third insulating layer, at least one first via, and at least one second via;

the first insulating layer, the second insulating layer and the third insulating layer are sequentially on the base substrate with the source electrode and the drain electrode;

each first via penetrates through the third insulating layer, and in each pixel unit with a plurality of chromatic color resists, each first via is between adjacent two chromatic color resists and filled by one of the adjacent two chromatic color resists; and each second via penetrates through the second insulating layer, a position of the at least one second via is in one-to-one correspondence with that of the at least one first via, a width of each second via is greater than a width of a corresponding first via in a direction parallel to the base substrate, and each second via is filled by a chromatic color resist having a same color as that of the chromatic color resist in the first via at a position corresponding to the second via;

wherein a central axis of each of the at least one first via coincides with a central axis of a corresponding second via in a direction perpendicular to the base substrate.

2. The array substrate according to claim 1, wherein a material of each of the first insulating layer and the third insulating layer comprises silicon oxide, and a material of the second insulating layer comprises silicon nitride.

3. The array substrate according to claim 2, wherein each of the first insulating layer and the third insulating layer has a thickness of 0.1 microns to 0.2 microns, and the second insulating layer has a thickness of 0.03 microns to 0.05 microns.

4. The array substrate according to claim 1, wherein each of the at least one first via has a width of 6 microns to 10 microns in the direction parallel to the base substrate.

5. The array substrate according to claim 4, wherein on a same side of a central axis of each first via, a distance between a side of the second via corresponding to the first via and a side of the first via in the direction parallel to the base substrate is 8 microns to 12 microns.

6. The array substrate according to claim 1, wherein in a direction perpendicular to the base substrate, a cross section of each of the at least one first via is a strip-shape, and a cross section of each of the at least one second via is a strip-shape.

7. The array substrate according to claim 6, wherein in the direction perpendicular to the base substrate, the cross section of each of the at least one first via is a rectangle, and the cross section of each of the at least one second via is a rectangle.

8. The array substrate according to claim 1, further comprising a color filter, wherein
the color filter is on the third insulating layer.

9. The array substrate according to claim 8, wherein the color filter comprises a red color resist, a green color resist and a blue color resist in each pixel unit;
in the pixel unit, the at least one first via comprises two first vias, and the at least one second via comprises two second vias; and
in the pixel unit, the blue color resist is filled in one of the two first vias and the second via at the position corresponding to the one of the two first vias, and the red color resist is filled in the other of the two first vias and the second via at the position corresponding to the other of the two first vias.

10. The array substrate according to claim 8, further comprising a planarization layer on the color filter.

11. A display panel, comprising the array substrate according to claim 1.

12. A display device, comprising the display panel according to claim 11.

13. A method for manufacturing an array substrate, comprising:
forming a semiconductor active layer, a gate electrode, a source electrode, and a drain electrode sequentially, on a base substrate by a patterning process;

forming a first insulating layer, a second insulating layer, and a third insulating layer sequentially, on the base substrate provided with the source electrode and the drain electrode;

performing a patterning process on the third insulating layer to form at least one first via penetrating through the third insulating layer, wherein in each pixel unit provided with a plurality of chromatic color resists, each first via is provided between adjacent two chromatic color resists and filled by one of the adjacent two chromatic color resists; and performing a patterning process on the second insulating layer to form at least one second via penetrating through the second insulating layer, wherein a position of the at least one second via is in one-to-one correspondence with that of the at least one first via, a width of each second via is greater than a width of a corresponding first via in a direction parallel to the base substrate, and each second via is filled by a chromatic color resist having a same color as that of the chromatic color resist in the first via at a position corresponding to the second via;

wherein a central axis of each of the at least one first via coincides with a central axis of a corresponding second via in a direction perpendicular to the base substrate.

14. The method according to claim 13, wherein the performing a patterning process on the third insulating layer to form at least one first via penetrating through the third insulating layer comprises:
coating a photoresist on the third insulating layer, and removing at least one portion of the photoresist above the at least one first via to be formed by exposure and development to form at least one preliminary via; and
etching the third insulating layer by using carbon tetrafluoride and oxygen to form the at least one first via penetrating through the third insulating layer.

15. The method according to claim 13, wherein an angle between a sidewall of each of the at least one preliminary via and the direction parallel to the base substrate is greater than 70°, and a thickness of the photoresist is greater than 1.8 microns.

16. The method according to claim 13, wherein the performing a patterning process on the second insulating layer to form at least one second via penetrating through the second insulating layer comprises:
etching the second insulating layer by using sulfur hexafluoride and oxygen to form the at least one second via penetrating through the second insulating layer; and
removing the photoresist through a stripping process.

17. The method according to claim 13, wherein each of the first insulating layer and the third insulating layer is made of silicon oxide, and the second insulating layer is made of silicon nitride.

18. The method according to claim 17, wherein each of the first insulating layer and the third insulating layer is formed to have a thickness of 0.1 microns to 0.2 microns, and the second insulating layer is formed to have a thickness of 0.03 microns to 0.05 microns.

19. The method according to claim 13, wherein in a direction perpendicular to the base substrate, each of the at least one first via is formed to have a cross section of a rectangle, and each of the at least one second via is formed to have a cross section of a rectangle.

* * * * *